HIGH FREQUENCY ELECTRO-OPTICAL DEVICE USING PHOTOSENSITIVE AND PHOTOEMISSIVE DIODES

Filed Nov. 29, 1963

JAMES R. BIARD,
GARY E. PITTMAN
INVENTORS

BY John D. Graham

ATTORNEY

3,304,430
HIGH FREQUENCY ELECTRO-OPTICAL DEVICE USING PHOTOSENSITIVE AND PHOTOEMISSIVE DIODES

James R. Biard, Richardson, and Gary E. Pittman, Dallas, Tex., assignors to Texas Instruments Incorporated, Dallas, Tex., a corporation of Delaware Filed Nov. 29, 1963, Ser. No. 327,131
11 Claims. (Cl. 250—217)

Figures 1, 2, 4:
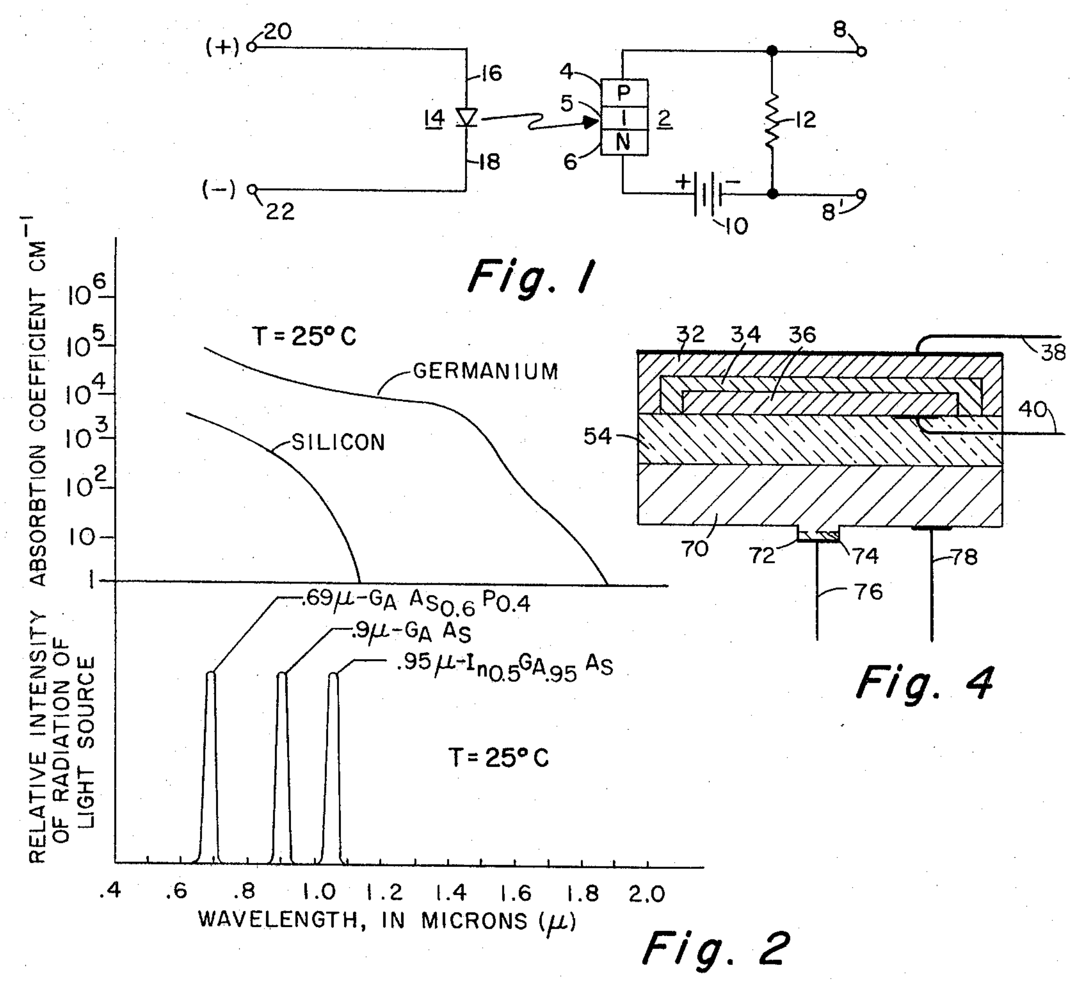

The present invention relates generally to a four-terminal active device for high frequency operation. More particularly, it relates to a four-terminal active device which has a pair of input terminals and a pair of output terminals electrically isolated threefrom, and is capable of power gain at high frequencies.

The high frequency capabilities of transistors are limited because of feedback through the device as a result of capacitances and resistances. The high frequency limitation on a device is readily seen when the device is characterized as a four-terminal network in terms of $h$ parameters, wherein the well known reverse voltage feedback ratio, $h_{12}$, is a measure of the high frequency limitation of the device. As the frequency is increased, $h_{12}$ increases because of the capacitive coupling inherent within the device. At very high frequencies, the direct transmission through the passive parts of the transistor completely outweighs and masks the transistor action in the device. And even though the transistor has, potentially, internal power gain at these frequencies, it cannot be realized at the terminals because of the parallel, direct feedthrough path.

There is provided by the present invention a solid-state active device capable of power gain at extremely high frequencies, wherein the device can be characterized as a truly four-terminal network with the reverse voltage feedback ratio, $h_{12}$, having a value of zero at all frequencies. The invention comprises a two-terminal, photosensitive, semiconductor active junction device electrically isolated from but optically coupled to a solid-state light source, the intensity of which can be modulated at frequencies into the microwave region. The photosensitive junction device absorbs optical radiation from the light source, and the junction characteristics vary as a function of the intensity thereof. The device is capable of power gain and response at very high frequencies, such as in the microwave region. The complete electrical isolation between the input and output terminals insures that no feedthrough will occur at these frequencies. Because of the solid-state nature of the entire device, it is readily adapted to miniature circuit applications.

Figure 3:
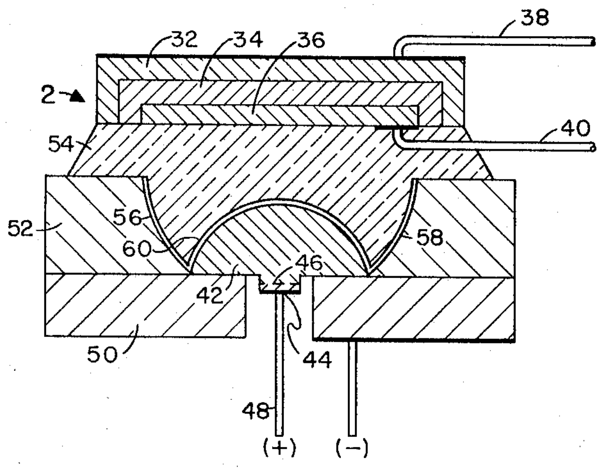

Other objects, features and advantages will become apparent from the following detailed description of the invention when taken in conjunction with the appended claims and the attached drawing wherein like reference numerals refer to like parts throughout the several figures, and in which:

FIGURE 1 is an electrical schematic diagram showing the device of the invention;

FIGURE 2 are graphical illustrations showing the relative coefficients of absorption of optical radiation as a function of wavelength for the semiconductor materials silicon and germanium as compared to the relative intensity of optical radiation as a function of wavelength for three different solid-state, semiconductor light sources comprised of gallium-arsenide-phosphide ($GaAs_{0.6}P_{0.4}$), gallium-arsenide (GaAs), and indium-gallium-arsenide ($In_{.05}Ga_{.95}As$), respectively;

FIGURE 3 is an elevational view in section of one embodiment of the invention; and FIGURE 4 is an elevational view in section of another embodiment of the invention.

Referring now to FIGURE 1, a photosensitive PIN diode 2 is connected in series with a source 10 of D.C. voltage through a load 12, the polarity of the voltage source being such as to reverse bias the diode to a high impedance state. A PIN diode is well known in the art and is comprised of a p-type conductivity region 4 and n-type conductivity region 6 separated therefrom by an intrinsic region 5. The diode is comprised of any suitable semiconductor material. Because of the semiconductor properties of the diode, it is photosensitive in that light of a suitable wavelength, when absorbed in the bulk of the diode body, produces hole-electron pairs which, when collected at the junctions between the intrinsic region and the p-type and n-type regions, cause the junction characteristics to vary. Optically coupled to the PIN diode is a solid-state, light source 14 which comprises a semiconductor junction diode which generates light of a characteristic wavelength when a forward current is caused to flow through the junction thereof. The intensity of light is a function of the forward current magnitude through the junction, and as will be seen hereinafter, the light intensity emitted by the diode can be modulated up to the microwave region. Terminals 20 and 22 are provided to the anode and cathode, respectively, of the light emitting diode for the application thereto of an electrical signal or series of high frequency pulses. Because of the structure of the PIN diode, it is capable of responding to light intensity variations of this frequency and to produce a signal across the load 12 which represents a power gain over the signal input to terminals 20 and 22. The complete electrical isolation between the light emitting diode 14 and photosensitive diode 2 insures that no feedthrough of any high frequency signal through passive resistances and capacitances occur. Thus, the device, which is shown within the dashed enclosure 15 of FIGURE 1, can be characterized as a true four-terminal network with complete electrical isolation between the input and output terminals, all of which is achieved by means of optical radiation. For purposes of this application, the terms optical radiation and light are used interchangeably and are defined as electro-magnetic radiation in the wavelength region from the near infrared into the visible spectrum.

In order to describe the operation of the device, it is helpful to consider briefly the general photosensitive nature of semiconductor junction devices. It is well known that semiconductor junction diodes, for example, are electrically sensitive to radiation incident at or near the junction of the diode. That is, radiation incident on the diode is absorbed thereby and creates electron-hole pairs within the bulk of the body. If the electron-hole pairs, which are current carriers, are created within a diffusion length of the carriers from the junction of the diode, they will be collected at the junction and cause the junction impedance to decrease. The sequence of events occuring when light is absorbed in the bulk of the diode body, which includes the creation of carriers and the flow of the carriers to the junction, do not take place instantaneously, and, therefore, an instantaneous impedance response to radiation incident upon a photosensitive diode is not possible. It is known, however, that the response time is primarily limited by the time required for the carriers to diffuse to the junction. Moreover, if the light is not absorbed within a minimum distance from the junction, the carriers created by the light absorption will never reach the junction and will have no effect upon the junction impedance.

In order to provide the high frequency detector of the invention, the intrinsic region 5 is provided between the p-type and n-type regions of the diode. Because of the reverse bias potential 10, a relatively large electric field is established within the intrinsic region to accelerate any carriers created therein to the junction regions. As will be described below, the construction of a photosensitive diode 2 and its orientation, with respect to the light emitting diode 14, is such that most of the light is absorbed in the intrinsic region 5 to insure a high collection efficiency of the light emitted by the diode 14. This is accomplished by making the intrinsic region relatively wide. Upon absorption of the light in the intrinsic region and the creation of carriers therein, which are holes and electrons, the electrons are accelerated toward the n-type region 6, and the holes are accelerated toward the p-type region 4, thus insuring that all of the carriers created by the light absorption reach the junction of the device. Moreover, the electric field established by the potential source 10 is large enough such that the carriers, during acceleration to the junctions, attain a terminal velocity almost instantaneously. That is, they are traveling at their maximum velocity, thus greatly reducing their transit time between the time of generation of the carriers and the time they reach the junction. It can be seen that the detector responds very rapidly to light absorption and is much faster than the conventional diodes in which the response time is largely determined by the diffusion rate of the carriers within the diode.

The photocurrent of the diode varies directly as a function of the intensity of the optical radiation. In essence, the diode 2 acts like the collector-base junction of a transistor, and the light emitting diode 14 acts as the emitter-base junction of the transistor when forward-biased. Since the emitter-base junction is forward biased, it is operating in its low impedance state, and the collector-base junction which is reversed biased, is operating in its high impedance state. The current gain of the over-all system is equal to the amount of current produced at the collector-base junction, which is the junction of the diode 2 in this instance, divided by the amount of current applied across the junction of the light emitting diode 14. Although the current gain of the over-all system of the invention does not attain unity, a large impedance and/or voltage gain can readily be achieved because of the large variation in impedance of the photosensitive diode junction in response to the intensity modulated light. Thus, a small voltage change across the junction of the light emitting diode 14 manifests itself as a large voltage change across the diode 2, and it can be readily seen that a power gain is easily achievable, even in the instance where the over-all efficiency of the solid-state light source 14 is small.

Because of the high frequency operation which the device is best suited, the junction capacitance of the diode 2 will begin to shunt the load impedance 12 as the frequency increases, since the PIN diode acts as a high frequency current source in parallel with the junction capacitance as the optical radiation is modulated in intensity at a high frequency. To cancel the shunting capacitive effect, suitable means, such as an inductor 13, can be connected in parallel with the PIN diode 2 which, for a selected frequency, will provide a resonant canceling effect.

A light emitting junction diode comprised of GaAs, is described in the co-pending application of Biard et al., entitled Semiconductor Device, Serial No. 215,642, filed August 8, 1962, assigned to the same assignee, and is an example of a suitable solid-state light source such as diode 14 of FIGURE 1. As will be described hereinafter in more detail, the diode can be comprised of other semiconductor materials to produce optical radiation of different wavelengths. As described in the above co-pending application, the diode comprises a body of semiconductor material, which contains a p-n rectifying junction. A forward current bias, when caused to flow through the junction, causes the migration of holes and electrons across the junction, and recombination of electron-hole pairs results in the generation of optical radiation having a characteristic wavelength or photon energy approximately equal to the band gap energy of the particular material from which the diode is fabricated. It will be noted from the above co-pending application that the generation of optical radiation in the diode is caused by a forward current bias at the junction and is an efficient solid-state light source as contracted to light generated by other mechanisms, such as reverse biasing the junction, avalanche processes, and so forth. The relative intensity of radiation as a function of wavelength for optical radiation generated by a gallium-arsenide p-n junction diode is shown in the lower graph of FIGURE 2, where it can be seen that the radiation intensity is greatest at a wavelength of .9 micron. A typical curve of the coefficient of absorption of light as a function of wavelength for silicon and germanium are shown in the upper graph of FIGURE 2, where it can be seen that the .9 micron wavelength radiation generated by gallium-arsenide diode will be absorbed by a body comprised either of silicon or germanium. Similar curves are shown for light generated by diodes comprised of gallium-arsenide-phosphide ($GaAs_{0.6}P_{0.4}$), and indium-gallium-arsenide ($In_{.05}Ga_{.95}As$), where it can be seen again that either a germanium or silicon body will absorb the light of wavelengths of .69 micron and 0.95 micron, respectively. These compositions are enumerated as examples only, and other useful compositions will be described below. It will also be noted from the graphs of absorption coefficients that before any appreciable absorption occurs in silicon or germanium, the photon energy must be at least slightly greater than the band gap energies of silicon and germanium, respectively. The band gap energies for silicon and germanium are 1.04 ev. and .63 ev., respectively. The graphs of FIGURE 3 show that absorption begins in silicon at a wavelength of about 1.15 microns, which corresponds to a photon energy of about 1.07 ev., and increases with shorter wavelengths; and absorptions begins in germanium at about 1.96 microns, which corresponds to a photon energy of about .64 ev., and increases with shorter wavelengths. These two energies are greater than the respective band gap energies of the two materials, which clearly indicates the band-to-band transitions of electrons upon absorption, which is the type of absorption with which the invention is concerned.

Since the optical radiation generated by the diode must be absorbed by the photosensitive PIN diode 2 in such a manner to cause an effect on the junction characteristics thereof, it is important to consider in more detail the absorption phenomenon. When light from diode 14 is absorbed in the PIN diode 2 and generates charge carriers, the carriers, which are holes and electrons, must diffuse to the junction regions therewithin in order to produce an effect on the junction characteristics. As noted earlier, the light need be absorbed anywhere in the intrinsic region 5 in order to insure the collection of a charge carrier at the junction. In other words, the invention is not concerned with the photoconductive effect within the material of the detector, but a junction effect, wherein the characteristics of the junction are altered when current carriers created by absorption of photons are collected at the junction. It can be seen from FIGURE 2 that the coefficient of absorption of light is less for longer wavelengths and, therefore, penetrates to a greater depth in a body of semiconductor material before being absorbed than does light of shorter wavelengths. If the junction of the PIN diode and the intrinsic region are parallel to the surface of the diode on which the optical radiation is incident, such as in the preferred embodiment of planar construction to be described below, it is important to determine the depths at which the intrinsic region should be located. For longer wavelength light, the intrinsic region in which the light is absorbed must be at a relatively large depth below the surface of the diode body in order that the majority of carriers produced by the light be collected. In other words, more depth of material is required before all of the light impinging on the surface of the diode body is absorbed, although a percentage of the light will be absorbed in each successive unit thickness of the body. Thus, the region over which the light is absorbed is relatively wide, and in order to insure the efficient collection at the junction of the majority of charge carriers generated thereby, a relatively wide intrinsic region is used. The intrinsic region width can be reduced for shorter wavelengths. For example, by using light of wavelength equal to .9 micron, such as from the GaAs light source of FIGURE 2, 63% of the light will be absorbed in the first .8 mil if the PIN diode is comprised of silicon. To achieve 99% absorption, an intrinsic region of about 2.5 mils would be necessary. For .9 micron light, however, a 63% collection efficiency is probably more desirable than a 99% collection efficiency in order to maintain the highest possible operating frequency, and yet maintain a reasonably high efficiency. For about a 100 volt difference supplied by supply 10 across an intrinsic region of width of about .8 mil, the carriers will travel at their terminal velocity of about $10^7$ cm./sec. and have a transit time of about $2\times10^{-10}$ second. The over-all optical collection efficiency is about 50%. By using light of shorter wavelength such as that generated by $GaAs_{0.6}P_{0.4}$ as shown in FIGURE 2, the transit time can be reduced by reducing the width of the intrinsic region, in addition to increasing the optical collection efficiency.

A side elevational view in section of one embodiment of the high frequency, four-terminal device of the invention is shown in FIGURE 3, which comprises a diffused semiconductor, photosensitive PIN diode 2 of planar construction and the semiconductor junction diode 14 optically coupled thereto. The diode 2 is comprised of semiconductor material such as germanium or silicon. There is also shown in FIGURE 3 a suitable structure for mounting the components of the four-terminal device to provide the necessary optical coupling therebetween. The light emitting junction diode comprises a hemispherical semiconductor region 42 of a first conductivity type and a smaller region 44 of an opposite conductivity type contiguous therewith. An electrical connection 48 is made to the region 44 and constitutes the anode of the junction diode, and the flat side of the region 42 is mounted in electrical connection with a metallic plate 52 with the region 44 and lead 48 extending into and through a hole in the plate. An electrical lead 50 is provided to the metallic plate 52 and constitutes the cathode of the diode. The diode is fabricated by any suitable process, such as, for example, by the diffusion process described in the above co-pending application or by any epitaxial process, to be described hereinafter, and contains a p-n rectifying junction 46 at or near the boundary between the regions 42 and 44.

The photosensitive PIN diode 2 comprises a semiconductor wafer 32 of a first conductivity type into which an impurity of the opposite conductivity determining type is diffused to form a circular region 34. Only a sufficient amount of this impurity is used in order to just compensate the impurity of region 32. Actually, the intrinsic region 34 is either slightly p-type or slightly n-type, but is a high resistivity region. Suitable diffusion times and temperatures are used to establish the proper resistivity and depth, which processes are well known in the art. An impurity of the same conductivity determining type as the original wafer 32 is diffused into the region 34 to form a third region 36 of relatively small area. An electrical connection is made to the region 32 by means of a wire 38, and another electrical connection is made to the region 36 by means of wire 40.

Another plate 54 is mounted about the diode and defines a hemispherical reflector surface 56 about the hemispherical dome 42. The photosensitive PIN diode is mounted above the hemispherical dome with the region 36 and base 34 facing the dome. A light transmitting medium 58 is used to fill the region between the reflector and the dome and for mounting the PIN diode above the dome, wherien the light transmitting medium acts as a cement to hold the components together. Ample space is provided between the top of the reflector plate 54 and the PIN diode for passing the lead 40 from the region 36 out of the region of the dome without being shorted to either the diode or the reflector plate. The lead is held in place by the cement-like transmitting medium. When a forward bias current is passed through the junction of the light emitting diode betwen the anode 48 and the cathode 50, light is emitted at the junction, travels through the dome 42 and the light transmitting medium 58 and strikes the surface of the PIN diode, where it is principally absorbed in the intrinsic region.

The hemispherical dome structure is preferably used in order to realize the highest possible quantum efficiency. If the proper ratio of the radius of the junction 46 to the radius of the hemispherical dome is selected, then all of the internally generated light that reaches the surface of the dome has an angle of incidence less than the critical angle and can be transmitted. The maximum radius of the diode junction with respect to the dome radius depends on the refractive index of the coupling medium, and since all of the light strikes the dome surface close to the normal, a quarter wavelength anti-reflection coating will almost completely eliminate reflection at the dome surface. The maximum radius of the light emitting diode junction to the dome radius is determined by computing the ratio of the index of refraction of the coupling medium to the index of refraction of the dome material. The dome, as shown in FIGURE 3, has a quarter wavelength anti-reflection coating 60 thereon comprised of zinc-sulfide to eliminate any possible reflection. A true hemispherical dome is optimum, because it gives the least bulk absorption to all spherical segments which radiate into a solid angle of $2\pi$ steradians or less. Spherical segments with height greater than their radius radiate into a solid angle less than $2\pi$ steradians, but have higher bulk absorption. Spherical segments with height less than either radius have less absorption but emit into a solid angle greater than $2\pi$ steradians and, therefore, direct a portion of the radiation away from the detector. Due to the presence of bulk absorption, the dome radius should be as small as possible to further increase the quantum efficiency of the unit.

The photosensitive PIN diode has a radius of about 1.5 times the radius of the hemispherical dome, which allows all the light emitted by the dome to be directed toward the detector by the use of a simple spherical reflecting surface 56. Since most of the light from the hemispherical dome strikes the transistor surface at high angles of incidence, an anti-reflection coating on the detector is not essential and can be considered optional. The light transmitting medium 58 between the dome and the PIN diode should have an index of refraction high enough with respect to the indices of refraction of the dome and the diode to reduce internal reflections, and to allow the ratio of the junction radius of the diode to the dome radius to be increased. The medium should also "wet" the surfaces of the source and the detector so that there are no voids which would destroy the effectiveness of the coupling medium. The indices of refraction of the light emitting diode and the PIN diode are each about 3.6. A resin such as Sylgard, which is a trade name of the Dow Corning Corporation of Midland, Michigan, has an index of refraction of about 1.43 and is suitable for use as the light transmitting medium. Although this index is considerably lower than 3.6, it is difficult to find a "transparent" substance that serves this purpose with a higher index. In order to insure the highest reflectivity, the reflector surface 56 is provided with a gold mirror 62 which can be deposited by plating, evaporation, or any other suitable process.

The metallic plates 52 and 54 are preferably comprised of a metal or alloy having the same or similar coefficient of thermal expansion as the light emitting diode, such as Kovar, for example. Similarly, the coupling medium 58 preferably has the same or similar coefficient of thermal expansion, or alternately remain pliable over a wide, useful temperature range of normal operation. Again, Sylgard satisfies this requirement by being pliable.

Various compositions of the light emitting diode and PIN diode have been mentioned in conjunction with the graphs of FIGURE 2, wherein the preferred compositions depend upon several factors including the absorption coefficient of the PIN diode, the ultimate efficiency to be achieved from the light emitting diode, and other factors as will be presently described. One factor to be considered is the speed of response of the PIN diode to the optical radiation, wherein it has been seen that light of shorter wavelength gives a faster response time because of the greater coefficient of absorption of the detector. This factor, if considered by itself, would indicate that a light emitting diode comprised of a material which generates the shortest possible wavelength is preferred. However, the efficiency of the light source must also be considered, in which the over-all efficiency can be defined as the ratio of the number of photons of light emerging from the dome to the number of electrons of current to the input of the diode, and the internal efficiency is the ratio of the number of photons of light generated in the diode to the number of input electrons.

It was pointed out in the above co-pending application that, in most cases, less of the light generated internally in the diode is absorbed per unit distance in the n-type region than in the p-type region. Moreover, n-type material can normally be made of higher conductivity than p-type material of the same impurity concentration. Thus, the dome is preferably of n-type conductivity material. In addition to this factor, it has been found that the greater the band gap of the material in which the light is generated, the shorter the wavelength of the light, wherein the frequency of the generated light is about equal to or slightly less than the frequency separation of the band gap. It has further been found that the light is absorbed to some extent in the material in which it is generated or in a material of equal or less band gap width, but is readily transmitted through a material having a band gap width at least slightly greater than the material in which the light is generated. In fact, a sharp distinction is observed between the efficient transmission of light through a composition whose band gap is slightly greater than the composition in which the light is generated, and through a composition having a band gap equal to or less than that of the generating composition. This implies that the light is readily transmitted through a material the frequency separation of the band gap of which is greater than the frequency of the generated light.

To take advantage of this knowledge, the light emitting diode, in the preferred embodiment, is comprised of two different compositions in which the junction at or near which the light is generated is located in a first region of the diode comprised of a material having a first band gap width and of p-type conductivity, and in which at least the major portion of the dome is comprised of a second material having a second band gap width greater than the first material and is of n-type conductivity. Thus, light generated in the first material has a wavelength which is long enough to be efficiently transmitted through the dome. There are several materials that have been found to be internally efficient light generators when a forward current is passed through a junction located therein, in addition to GaAs noted in the above copending application. The material indium-arsenide, InAs, has a band gap width of about .7 ev. and, if a p-n junction is formed therein, will generate light having a wavelength of about 3.8 microns, whereas light from GaAs is about .9 micron. The compositions $In_xGa_{1-x}As$, where $x$ can go from 0 to 1, give off light of wavelength which varies approximately linearly with $x$ between 3.8 microns for InAs when $x=1$ to .9 micron for GaAs when $x=0$. On the other side of GaAs is the composition gallium-phosphide, GaP, which has a band gap of about 2.25 ev. and emits radiation of about .5 micron. Also, the compositions $GaAs_xP_{1-x}$, where $x$ can go from 0 to 1, give off light of wavelength which varies approximately linearly with $x$ between .9 micron for GaAs when $x=1$ to .5 micron for GaP when $x=0$. It has been found, however, that for various reasons, the internal efficiency of light generation begins to drop off when the band gap of the material used is as high as about 1.8 ev., which approximately corresponds to the composition $GaAs_{0.6}P_{0.4}$, or for $x$ equal to or less than about 0.6 for the compositions $GaAs_xP_{1-x}$.

Referring again to the FIGURE 3 and more specifically to the construction of the light emitting diode, a preferred embodiment comprises a dome 42 of n-type conductivity material with a smaller region 44 contiguous therewith in which a portion is of p-type conductivity. The region 44 is comprised of a composition having a first band gap width, and the dome 42 is comprised of a region having a second band gap width greater than that of region 44. The rectifying junction 46 is formed in the region 44 of smaller band gap width so that the light generated therein will be efficiently transmitted through the dome. The portion of region 44 between the junction 46 and the dome is of n-type conductivity. Referring to the graphs of FIGURE 2 and the foregoing discussion, a preferred composition for the region 44 is one which will generate as short a wavelength as possible in order to have a high coefficient of absorption in the transistor for fast switching action, and yet which will be efficiently transmitted by the dome 42. At the same time, the composition of region 44 should have a high internal efficiency as a light generator. The composition $GaAs_{0.6}P_{0.4}$ will efficiently produce light of wavelength of about .69 micron and constitutes a preferred material for the smaller region 44. By making the dome of a composition of band gap slightly greater than that of the region 44, such as $GaAs_{0.5}P_{0.5}$, for example, or for $x$ equal to or less than 0.5 for the compositions $GaAs_xP_{1-x}$, the light will be efficiently transmitted. It should be noted that although the dome is comprised of a composition that does not have a high internal efficiency of light generation, this is unimportant, since the light is actually generated in the smaller region 44 of high efficiency. Thus, the dome material can be extended to compositions of relatively high band gap widths, even to GaP, without decreasing the over-all efficiency of the unit.

Other compositions and combinations thereof can be used, such as various combinations of $In_xGa_{1-x}As$ or $GaAs_xP_{1-x}$, or both. In addition, most III–V compounds can be used, or any other material which generates light by a direct recombination process when a forward current is passed through a rectifying junction therein. Moreover, the entire light emitting diode can be comprised of a single composition such as, for example, GaAs as described in the above co-pending application. It can, therefore, be seen how the compositions of the various components of the system can be varied to achieve various objectives, including the highest over-all efficiency of the entire system. Undoubtedly, other suitable compositions and combinations thereof will occur to those skilled in the art.

The light emitting diode can be made by any suitable process. For example, if two different compositions are used, a body or wafer constituted of a single crystal of one of the compositions can be used as a substrate onto which a single crystal layer of the other composition is deposited by an epitaxial method, which method is well known. Simultaneous with or subsequent to the epitaxial deposition, the rectifying junction can be formed in the proper composition, slightly removed from the boundary between the two, by the diffusion of an impuirty that determines the opposite conductivity type of the composition. By etching away most of the composition containing the junction, the small region 44 can be formed. If the entire light emitting diode is comprised of a single composition, a simple diffusion process can be used to form the junction. The shape of the dome is formed by any suitable method, such as, for example, by grinding or polishing the region 42.

Another embodiment of the invention is shown in FIGURE 4, which is an elevational view in section of a planar constructed light emitting diode optically coupled to a PIN detector diode as shown in FIGURE 3. The light emitting diode comprises a wafer 70 of semiconductor material of a first conductivity type into which is diffused an impurity that determines the opposite conductivity type to form a region 72 of said opposite conductivity type separated from the wafer 70 by a rectifying junction 74. The wafer is etched to cut below the junction and form the small region 72. Alternatively, the region 72 can be formed by an epitaxial process. Electrical leads 76 and 78 are connected to the region 72 and wafer 70 as previously described.

The wafer 70 is not formed into a dome structure in this embodiment, but is left in a planar configuration and optically coupled to the detector, as shown, with a suitable coupling medium 58 as noted earlier. This embodiment is more expedient to fabricate, as can be readily seen, and thus is advantageous in this respect. As indicated above, the dome structure is used to realize a high quantum efficiency, since all of the internally generated light strikes the surface of the dome at less than the critical angle, and thus little, if any, light is lost to internal reflections within the dome. This is not necessarily the case in the planar embodiment of FIGURE 4, and in order to achieve a high quantum efficiency, the diameter of the apparent light emitting surface of wafer 70, assuming a circular geometry, can be made somewhat smaller than the combined diameters or lateral dimensions across the two emitters of the detector. The apparent light emitting surface of the diode is determined by the thickness of wafer 70, the area of the light emitting junction 74, and the critical angle for total internal reflection. The critical angle of reflection is determined by computing the arcsine of the ratio of the index of refraction of the coupling medium 54 to the index of refraction of the semiconductor wafer 70.

In the preceding discussions, it was noted that a coupling medium having a suitable index of refraction is preferably used between the light emitting diode and the detector. If such a medium is used, it should have a high index to match, as closely as possible, that of the two components between which it is situated. Materials other than Sylgard can also be used, such as a high index of refraction glass. However, it can prove expedient and desirable in certain cases to couple the two components together with air, where a physical coupling is either impractical or impossible, and such a system is deemed to be within the intention of the present invention.

Although the preferred embodiment of the light emitting diode contains the junction in the region 44 below the boundary between the two regions 42 and 44, the junction can also be formed at this boundary or actually within the dome region 42 should this be more expedient for one or more reasons. In the case where the entire diode is comprised of a single composition, for example, an equally efficient light emitter can be made by locating the junction other than as shown in the preferred embodiment.

Other modifications, substitutions and alternatives will undoubtedly occur that are deemed to fall within the scope of the present invention, which is intended to be limited only as defined in the appended claims.

What is claimed is:

1. A four terminal electro-optical active device, comprising:

(a) a photosensitive diode comprised of a first semiconductor material having a p-type conductivity region of relatively high electrical conductivity and an n-type conductivity region of relatively high electrical conductivity separated from said p-type region by an intermediate region of relatively low electrical conductivity, (b) electrical contacts to said p-type region and said n-type region constituting a pair of output terminals, (c) potential means electrically coupled to said photosensitive diode creating an electric field across said intermediate region between said p-type region and said n-type region, to reverse bias said diode, (d) said photosensitive diode being characterized by the absorption of optical radiation incident thereon which has a photon energy greater than the band gap energy of said first semiconductor material for generating excess minority carriers therein and being responsive to said excess minority carriers to alter the reverse diode characteristics of said photosensitive diode when said optical radiation is absorbed within said intermediate region, (e) a light emitting diode electrically isolated from but optically coupled to said photosensitive diode for generating optical radiation which is directed on said photosensitive diode and having a first region of one conductivity type and a second region of an opposite conductivity type contiguous to and forming a rectifying junction with said first region, (f) said light emitting diode being characterized by the generation of said optical radiation when a forward current is caused to flow through the rectifying junction thereof, (g) said optical radiation generated by said light emitting diode being characterized by a photon energy greater than the band gap energy of said first semiconductor material, and (h) electrical contacts to said first and said second regions of said light emitting diode constituting a pair of input terminals for conducting said forward current.

2. A four terminal electro-optical active device according to claim 1 wherein said intermediate region is intrinsic.

3. A four terminal electro-optical active device according to claim 1 wherein said potential means reverse biasing said photosensitive diode creates a depletion layer between said p-type region and said n-type region across said intermediate region.

4. A four terminal electro-optical active device according to claim 1 including an output circuit interconnected with said output terminals which includes a load.

5. A four terminal electro-optical active device according to claim 1 including means interconnected with said input terminals for supplying said forward current.

6. A four terminal electro-optical active device according to claim 1 wherein said photosensitive diode defines a substantially planar exterior surface facing said light emitting diode with said intermediate region forming substantially planar boundaries with said p-type region and said n-type region which are substantially parallel to said exterior surface.

7. A four terminal electro-optical active device according to claim 1 wherein said second region of said light emitting device is disposed between said first region thereof and said photosensitive diode with said first region and a portion of said second region being comprised of a third semiconductor material having a band gap energy greater than that of said first semiconductor material, and the rest of said second region being comprised of a third semi-conductor material having a band gap energy greater than that of said second semiconductor material.

8. A four terminal electro-optical device according to claim 1 wherein said second region of said light emitting diode is disposed between said first region thereof and said photosensitive diode and defines a hemisphere facing said photosensitive diode with said rectifying junction being substantially parallel to the base thereof.

9. A four terminal electro-optical active device according to claim 8 including a reflecting surface disposed laterally about said hemisphere for directing said optical radiation on said photosensitive diode.

10. A four terminal electro-optical active device according to claim 1 wherein said second region of said light emitting diode is disposed between said first region thereof and said photosensitive diode and defines a substantially planar surface facing said photosensitive diode.

11. A four terminal electro-optical active device according to claim 1 wherein said rectifying junction of said light emitting diode is located within a second semiconductor material selected from the group consisting of compounds of elements of Groups III and V of the Periodic Table and mixed combinations thereof, and said first semiconductor material is selected from the group consisting of silicon and germanium.

References Cited by the Examiner

UNITED STATES PATENTS

| | | | |
|---|---|---|---|
| 3,043,958 | 7/1962 | Diemer | 250—211 |
| 3,043,959 | 7/1962 | Diemer | 250—211 |
| 3,229,104 | 1/1966 | Rutz | 250—217 |

OTHER REFERENCES

Gilleo et al.: Electronics, November 22, 1963, pp. 23–27.

Wolff: Electronics, June 21, 1963, pp. 24, 25.

Wolff: Electronics, June 28, 1963, pp. 32–34.

RALPH G. NILSON, *Primary Examiner.*

WALTER STOLWEIN, *Examiner.*